United States Patent [19]
Jeng

[11] Patent Number: 6,140,826
[45] Date of Patent: Oct. 31, 2000

[54] METHOD AND APPARATUS FOR CONDUCTING FAILURE ANALYSIS ON IC CHIP PACKAGE

[75] Inventor: Jeng-Kuo Jeng, Taipei, Taiwan

[73] Assignee: Vanguard International Semiconductor Corporation, Hsinchu, Taiwan

[21] Appl. No.: 09/488,456

[22] Filed: Jan. 20, 2000

Related U.S. Application Data

[62] Division of application No. 08/675,607, Jul. 31, 1996, Pat. No. 6,020,748.

[51] Int. Cl.⁷ ............................................... G01R 31/02
[52] U.S. Cl. ................................. 324/755; 324/765
[58] Field of Search .................... 324/754, 755, 324/765, 751, 752; 439/66–74

[56] References Cited

U.S. PATENT DOCUMENTS

| | | |
|---|---|---|
| 3,335,327 | 8/1967 | Damon et al. . |
| 3,354,394 | 11/1967 | James . |
| 3,366,914 | 1/1968 | McManus et al. . |
| 3,391,383 | 7/1968 | Antes . |
| 4,312,117 | 1/1982 | Robillard et al. . |
| 4,329,642 | 5/1982 | Luthi et al. . |
| 4,437,718 | 3/1984 | Selinko . |
| 4,679,118 | 7/1987 | Johnson et al. . |
| 5,006,792 | 4/1991 | Malhi et al. . |
| 5,381,036 | 1/1995 | Bigler et al. . |
| 5,838,159 | 11/1998 | Johnson .................. 324/751 |

OTHER PUBLICATIONS

"Novel Failure Analysis Techniques Using Photon Probing With A Scanning Optical Microscope", IEEE/IRPS, Cole Jr. et al., (month unavailable) 1994, pp: 388–397.

*Primary Examiner*—Ernest Karlsen
*Attorney, Agent, or Firm*—Tung & Associates

[57] ABSTRACT

The present invention is concerned with a method and apparatus for performing a failure analysis on an integrated circuit chip package by mounting the package in a printed circuit board that is equipped with a recess (or an aperture) adapted for receiving the package and then making an electrical connection between the pin leads on the package and the terminals on the board such that when a backside surface layer of the package is later removed to expose the active circuit in the chip, the electrical connection between the chip and the board is substantially maintained so that a bias voltage can be fed into the chip to perform the failure analysis.

7 Claims, 1 Drawing Sheet

METHOD AND APPARATUS FOR CONDUCTING FAILURE ANALYSIS ON IC CHIP PACKAGE

This is a divisional of copending application(s) Ser. No. 08/675,607 filed on Jul. 3, 1996, now U.S. Pat. No. 6,020,748.

FIELD OF THE INVENTION

The present invention generally relates to a method and apparatus for testing an integrated circuit chip package for failure analysis and more particularly, relates to a method and apparatus for performing a failure analysis on an integrated circuit chip package by mounting the package in a printed circuit board that is equipped with a recess adapted to receive the package and making electrical connection between the package and the board such that when a layer of the package is later removed to expose the die back for performing the failure analysis, the electrical connection between the package and the board is substantially maintained.

BACKGROUND OF THE INVENTION

In the semiconductor fabrication technology, the capability and effectiveness of performing a failure analysis on a semiconductor chip package are very important. When an integrated circuit (IC) chip fails in service, the nature and the cause for such failure must be determined in order to prevent the reoccurrence of such failure in similar products.

An IC chip is normally built on a silicon base substrate with many layers of insulating materials and metal interconnections. This type of multi-layer structure becomes more important in modern IC devices such as high density memory chips where, in order to save chip real estate, the active device is built upwards in many layers forming transistors, capacitors and other logic components.

When an IC device is found defective during a quality control test, various failure analysis techniques can be used to determine the cause of such failure. Two of the more recently developed techniques for performing failure analysis are the infrared light emission microscopy and the light-induced voltage alteration (LIVA) imaging technique. In the infrared light emission light analysis, an infrared light transmitted through a substrate silicon material is used to observe from the backside of an IC the failure mode of the circuit. For instance, at a magnification ratio of 100x, a failure point in the circuitry can be located. The LIVA imaging technique can be used to locate open-circuited and damaged junctions and to image transistor logic states. The LIVA images are produced by monitoring the voltage fluctuation of a constant current power supply when a laser beam is scanned over an IC. A high selectivity for locating defects is possible with the LIVA technique.

Another method that has become more common in failure analysis of IC chips is the scanning optical microscopy (SOM). The high focusing capability of SOM provides improved image resolution and depth comparable to conventional optical microscopy. It is a useful tool based on the laser beam's interaction with the IC. The SOM technique enables the localization of photocurrents to produce optical beam induced current image that show junction regions and transistor logic states. Several major benefits are made possible by the SOM method when compared to a conventional scanning electron microscopy analysis. For instance, the benefits include the relative ease of making IC electrical connection, the no longer required vacuum system and the absence of ionizing radiation effects.

Regardless which one of the failure analysis techniques is adopted, an IC chip package must be properly prepared with a suitable surface for performing a failure analysis. Since most modern IC chips utilize at least two or more layers of metal thin films as interconnect layers, the active components of the chip on which the failure analysis is to be performed are usually shielded by the metal interconnect layers. Great difficulties are encountered in performing any of the failure analysis techniques, i.e. the infrared light emission microscopy, the LIVA imaging technique or the SOM technique, which cannot penetrate the layers of metals to detect the failure mode in the circuit. In another more recently developed package for IC chips, the lead-on-chip (LOC) package, both the lead frame and the bounding wires are positioned on top of the IC circuit. The LOC package has been used in modern high density memory devices wherein a plurality of finger leads are disposed on and attached to an active surface of an IC chip. The benefits of using a LOC package is that the ratio between the size of an IC chip and the size of a package (which encapsulates the chip) is significantly higher than conventional packages since the mounting area (die pad) is no longer required in a LOC package. A high ratio between the chip size and the package size is very desirable in the ever increasing miniaturization of IC devices. Since a metal lead frame is used in a LOC package which substantially covers the active device, it would not be possible to perform a failure analysis on the top surface of a LOC package.

Attempts have been made by others to perform failure analysis on the back surface of an IC chip package. For instance, the back surface of an IC chip package can be polished away to remove the encapsulating material and to expose the die back. A problem in such an approach is that the pin leads connecting the IC circuit can be easily damaged during the polishing process. As a result, the damaged pin leads cannot be electrically connected by soldering to a printed circuit board or by clamping to a test socket. As a consequence, a bias voltage which is required for performing the failure analysis cannot be applied to the circuit. The problem of making an electrical connection to the circuit to be tested therefore renders the performance of a failure analysis impossible.

It is therefore an object of the present invention to provide a method and apparatus for conducting a failure analysis on an IC chip package that do not have the drawbacks and shortcomings of the conventional method and apparatus for performing failure analysis.

It is another object of the present invention to provide a method and apparatus for conducting a failure analysis on an IC chip package that is capable of performing such test on a chip which has multiple layers of metal films built on the chip as interconnect layers shielding the active components.

It is a further object of the present invention to provide a method and apparatus for conducting a failure analysis on an IC chip package that can be performed on packages wherein a lead frame and a multiplicity of bonding wires are positioned on top of the active components.

It is another further object of the present invention to provide a method and apparatus for conducting a failure analysis on an IC chip package wherein the package can be mounted in a printed circuit board equipped with a recess or an aperture.

It is yet another object of the present invention to provide a method and apparatus for conducting a failure analysis on an IC chip package wherein electrical connections can be made between the IC chip and a printed circuit board prior to a surface preparation process.

It is still another object of the present invention to provide a method and apparatus for conducting a failure analysis on an IC chip package wherein the backside surface of the package can be removed by mechanical means without substantially damaging the electrical connections between the chip and the printed circuit board on which the chip is mounted.

It is yet another further object of the present invention to provide a method and apparatus for conducting a failure analysis on an IC chip package wherein the backside of the package can be prepared for failure analysis by an infrared light emission microscopy technique, a light-induced voltage alteration imaging technique or a scanning optical microscopy technique.

It is still another further object of the present invention to provide a method and apparatus for conducting a failure analysis on an IC chip package wherein a surface layer on the backside of the package can be removed for failure analysis by a light emitting or laser emitting technique.

It is still another further object of the present invention to provide a method of conducting a failure analysis on an IC chip package wherein pin leads on the chip are first connected to terminals on a printed circuit board such that a bias voltage can be applied to the chip after a surface layer on the backside of the package is removed.

SUMMARY OF THE INVENTION

In accordance with the present invention, a method and an apparatus for conducting a failure analysis on an IC chip package by using a printed circuit board that has a built-in recess adapted to receive an IC chip package such that pin leads on the chip can be first connected to terminals on the board prior to a surface preparation process are provided.

In a preferred embodiment, a printed circuit board adapted for use in a failure analysis of an IC chip package is provided which includes a board member equipped with a plurality of terminals emanating from a recess in the top surface of the board member, the plurality of terminals each has an inner end terminating at the recess in the board and an outer end terminating at an periphery of the board, the inner ends of the terminals are adapted to engage pin leads on an IC chip package and the outer ends are adapted to be connected to external circuits. The printed circuit board is equipped with a recess formed in the top surface of the board member adapted to engage the IC chip package.

In the preferred embodiment, the recess formed in the top surface of the board member has a depth of at least one half of the thickness of the IC chip package such that the package can be securely mounted in the recess and furthermore, electrical connections between the pin leads on the IC chip and the terminals on the printed circuit board can be made.

In an alternate embodiment, the recess formed in the top surface of the board member adapted to engage the IC chip package is an aperture formed through the board member such that the front surface of the package can be mounted flush with the bottom surface of the printed circuit board and electrical connections between the pin leads on the chip package and the terminals on the board can be made.

The electrical connections between the pin leads on the chip package and the terminals on the printed circuit board made prior to the surface polishing on the backside of the package is substantially maintained after the polishing process so that a bias voltage can be applied to the IC circuit to conduct the failure analysis.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND ALTERNATE EMBODIMENTS

The present invention provides a method and apparatus for testing an IC chip package for failure analysis by mounting the package in a printed circuit board that is equipped with a recess for mounting the package and then making electrical connection between the package and the board such that when a surface layer on the backside of the package is later removed to perform the failure analysis, the electrical connection between the package and the board is substantially maintained.

The present invention method and apparatus overcome the drawbacks and shortcomings of the conventional method and apparatus for testing IC chip packages which inevitably damage pin leads on the chip package during a polishing process to remove a layer of the encapsulating material on the backside of the package to the extent that electrical connections cannot be made to the package and failure analysis cannot be performed. To overcome such drawbacks, the present invention discloses a novel printed circuit board that has a recess built-in in the top surface of the board. The recess allows the mounting of an IC chip package and the electrical connection between the IC chip package and the printed circuit board prior to the removal of a back layer on the package. Once the electrical connection is made between the IC chip package and the printed circuit board by a solder reflow method (or any other suitable means), a surface layer on the backside of the IC chip package can be removed until a die back is exposed. The electrical connection is substantially maintained after the removal process such that a bias voltage can be applied to the IC circuit for performing the failure analysis.

Figure 1:
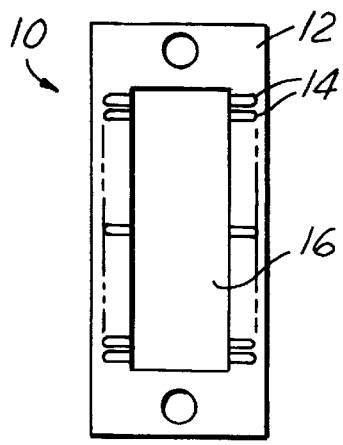
FIG. 1 is a plane view of a present invention printed circuit board.

A present invention printed circuit board 10 is shown in FIG. 1. The board is constructed by a board member 12 made of an insulating material such as a thermoset plastic commonly used in the semiconductor industry. A plurality of terminals 14 are formed in a row form on two sides of the recess 16 in the board member 12. The plurality of terminals 14 are formed such that the total number corresponds to the number of pin leads on an IC chip package that is to be later tested. In the example given in FIG. 1, the total number of the plurality of terminals 14 is 42. Terminals 14 can be formed by conventional means on the board member 12. It should be noted that the plurality of terminals 14 may not be formed on both sides of the recess 16. The terminals can be formed on all four sides of the recess 16 or on only one side of the recess depending on the arrangement of the pin leads on the IC chip package. The thickness of the board member 12 is generally between about 1 mm and 2 mm, and preferably about 1.3 mm.

It should be noted that while in FIG. 1 the recess 16 in the board member 12 is an aperture formed through the board, in other arrangements such as in a thick printed circuit board, it may only require a recess to be formed in the board. In general, the depth of the recess 16 (or the aperture) should be at least more than half of the thickness of the IC chip package. This is needed so that the chip package can be securely mounted in the board to position the pin leads on the package tightly against the terminals on the board such that they can be soldered together. The depth requirement for the recess in the board further ensures a secure mounting of the package during a subsequent grinding/polishing process wherein a surface layer on the backside of the package is removed.

Figure 2:
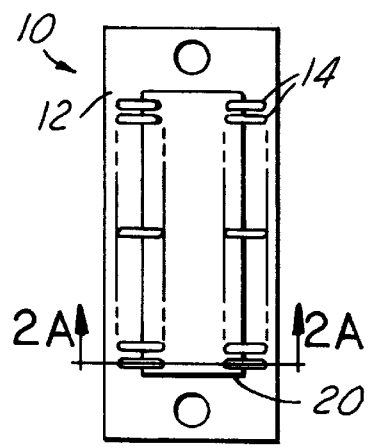
FIG. 2 is a plane view of the printed circuit board shown in FIG. 1 with an IC chip package mounted in an aperture.

Referring now to FIG. 2, wherein an IC chip package 20 is shown positioned in the printed circuit board 10. It is seen that the package 20 is securely positioned in the recess 16 shown in FIG. 1. While the IC chip package 20 shown in FIG. 2 is that of the small outline J-lead (SOJ) type, i.e. a 300 mil SOJ package, any other chip packages that is suitable for the present invention apparatus of printed circuit board can be utilized. For instance, other chip packages such as a thin small outline package (TSOP), plastic dual in-line package (PDIP), thin quad flat package (TQFP), and plastic lead chip carrier (PLCC) can also be suitably used in the present invention apparatus. In the example shown in FIG. 2, the 300 mil SOJ package has a length of 680 mil, a width of 300 mil and a thickness of 118 mil. To accommodate a chip package of such dimensions, a suitable recess (or aperture) should have a length slightly larger than 680 mil, a width slightly larger than 300 mil and a depth slightly larger than half of the thickness of the package, or approximately 60 mil. These dimensions would be different for other applications of the present invention apparatus such that other chip packages having different dimensions can be fitted in the recess (or aperture).

Figure 2A:
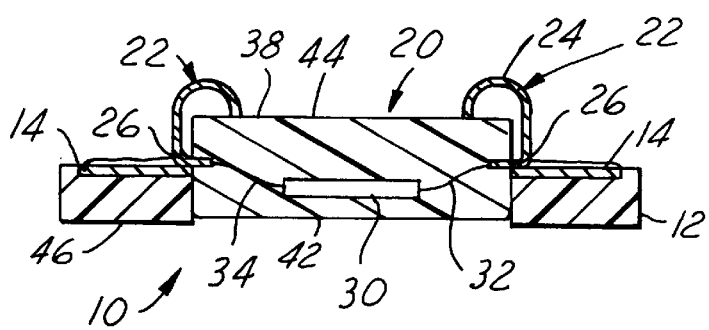
FIG. 2A is an enlarged, cross-sectional view of the printed circuit board and the IC chip package shown in FIG. 2.

It is important that when the chip package 20 is positioned in the aperture 16 of the printed circuit board 10, as shown in FIG. 2A, the pin lead 22 which has an upper curved portion 24 and a lower curved portion 26 should be securely positioned on terminal 14 and maintain good contact. The lower curved portion 26 and the terminal 14 should have an intimate contact between them so that there is no gap. The outer surface of the lower curved portion 26 can be coated with a solder material (not shown) so that the solder is in intimate contact with the terminal 14.

In an enlarged, cross-sectional view of FIG. 2A, an active device 30 having input/output lines 32 and 34 also shown for illustrative purpose. It should be noted that the device 30 is shown greatly simplified to illustrate one of the important features of the present invention, i.e. the connection between line 32 (or 34) and the lower curved portion 26 of the pin lead 22. This connection allows a bias voltage to be applied to the active device 30 in a failure analysis test.

The cross-sectional view in FIG. 2A also shows that the active device 30 is encapsulated in an epoxy, or any other suitable insulating material, 38.

It should be noted that, as shown in FIG. 2A, the IC chip package 20 is positioned in the printed circuit board 10 in an upside down position such that the front surface 42 is flush with the surface 46 of the printed circuit board 12. The back surface 44 having the upper curved portion 24 of the pin leads 22 protruding therefrom is facing upwardly as shown in FIG. 2A.

After the IC chip package 20 is securely positioned in the recess 16 of the printed circuit board 10, a solder reflow process such as an infrared reflow process or a vapor phase reflow (VPR) process can be carried out to melt the solder coated on the lower curved portion 26 (not shown) so that the lower curved portion 26 and the terminal 14 are soldered together to provide a good electrical connection. Other solder reflow process or other soldering process can also be suitably used to achieve the same desirable result.

Figure 3:
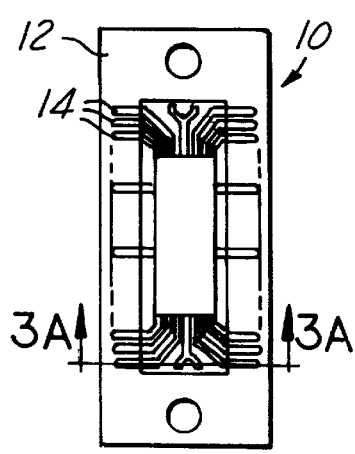
FIG. 3 is a plane view of the printed circuit board and the IC chip package of FIG. 2 after a surface layer on the backside of the package is removed.
Figure 3A:
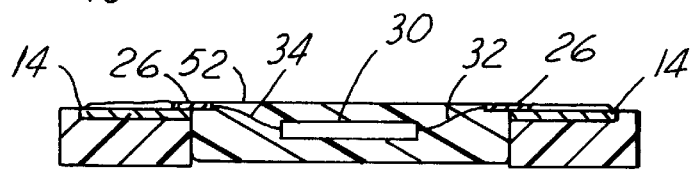
FIG. 3A is an enlarged, cross-sectional view of the printed circuit board and the IC chip package of FIG. 3.

Referring now to FIG. 3 which shows a plane view similar to that shown in FIG. 2 but after a grinding/polishing process is conducted during which a backside surface layer is removed to reveal a die back 52 (FIG. 3A). It should be noted that, depending on the type of chip package that is processed, variable grinding/polishing conditions can be adapted for removing the backside surface layer of the package 20. A chemical mechanical polishing method is one of the suitable techniques that can be used to accomplish the purpose.

As shown in an enlarged, cross-sectional view of FIG. 3A, the upper curved portion 24 has been removed during the polishing process such that only a thin layer of the lower curved portion 26 remains which connects the input/output line 34 (or 32) of the active device 30 to terminal 14. A smooth surface of die back 52 is obtained after the polishing process. It should be noted that while the view in FIG. 3A is greatly exaggerated, the top surfaces of terminal 14, lower curved portion 26 and the die back 52 should all be in the same plane after the polishing process. The soldered joint that is maintained after polishing between the lower curved portion 26 and the terminal 14 provides the necessary electrical connection in the present invention method for feeding, a bias voltage to the active device 30 through terminal 14, lower curved portion 26 and input/output line 34 (or 32) to carry out a failure analysis test.

Figure 4:
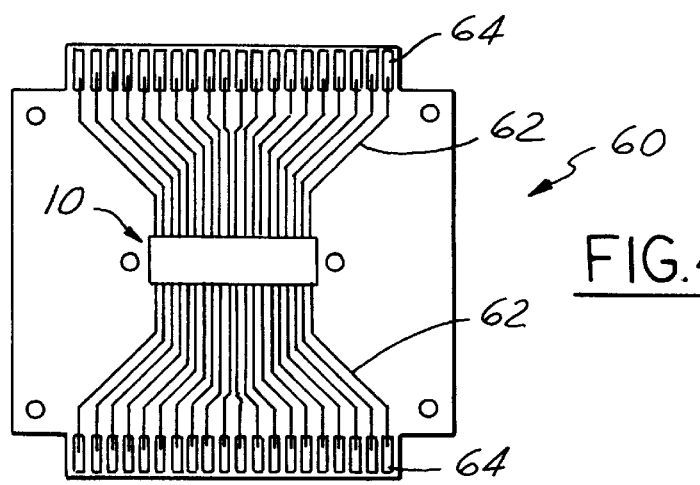
FIG. 4 is a plane view of a variation of the present invention printed circuit board.

FIG. 4 illustrates a variation of the present invention printed circuit board. On printed circuit board 60, an insert section 10 similar to that shown in FIG. 1 is used. On board 60, a plurality of traces 62, normally made of copper or any other suitable conductive metal, is laid out such that a plurality of terminals 64 is provided and can be electrically connected to an external test device. The terminals 64 are arranged in such a way that they can be conveniently plugged into a socket (not shown) for performing a failure analysis test.

While the present invention has been described in an illustrative manner, it should be understood that the terminology used is intended to be in a nature of words of description rather than of limitation.

Furthermore, while the present invention has been described in terms of a preferred embodiment and an alternate embodiment it is to be appreciated that those skilled in the art will readily apply these teachings to other possible variations of the inventions.

The embodiments of the invention in which an exclusive property or privilege is claimed are defined as follows:

1. A method of performing a failure analysis on an integrated circuit chip package comprising the steps of:
   providing an integrated circuit chip package having a plurality of pin leads extending therefrom, a top surface adjacent to bonding wires in the chip, and a bottom surface adjacent to an active device in the chip,
   providing a printed circuit board having a plurality of terminals on a top surface and a recess, said plurality of terminals having inner ends adapted for engaging said pin leads on said integrated circuit chip package, and outer ends terminating at an periphery of the board,
   positioning the integrated circuit chip package in the recess of the printed circuit board with the bottom surface of the package facing upward and connecting electrically the pin leads on the package to the inner ends of said terminals on the board, removing a layer off the bottom surface of said package while maintaining substantially the electrical connection between the pin leads on the package and the inner ends of the terminals on the board, and connecting said outer ends of said plurality of terminals to external circuits for performing failure analysis.

2. A method according to claim 1, wherein said integrated circuit chip package is selected from the group consisting of a lead-on-chip (LOC) package, a small outline J-lead (SOJ) package and a thin small outline package (TSOP).

3. A method according to claim 1, wherein said recess has a depth of at least one half of the thickness of said integrated circuit chip package.

4. A method according to claim 1, wherein said recess is an aperture through said board member.

5. A method according to claim 1, wherein said external circuits comprise an IC chip package test apparatus.

6. A method according to claim 1, wherein said failure analysis comprises an IR light emission microscopy analysis or a light-induced voltage alteration imaging analysis.

7. A method according to claim 1, wherein said electrical connection between said pin leads on said package and said inner ends of said terminals on the board is made by an IR reflow technique or a vapor phase reflow technique.

* * * * *